United States Patent Office 3,817,876

Patented June 18, 1974

3,817,876

PHOTOSENSITIVE POLYMER AND COMPOSITION

Hideo Fukutani and Konoe Miura, Tokyo, Japan, assignors to Mitsubishi Chemical Industries, Ltd., Tokyo, Japan No Drawing. Filed Sept. 16, 1971, Ser. No. 181,188
Claims priority, application Japan, Sept. 16, 1970, 45/81,116
Int. Cl. C08g *23/22*
U.S. Cl. 260—2 A 5 Claims

ABSTRACT OF THE DISCLOSURE

A photosensitive composition comprising a photosensitive polymer containing at least one $\alpha,\beta$-unsaturated carboxylic radical of the formula:

$$\mathrm{Ar{-}(YC{=}CX)_n{-}\underset{\underset{\displaystyle O}{\|}}{C}{-}O{-}}$$

wherein X and Y, respectively, represent a hydrogen or halogen atom, or a cyano or nitro radical; Ar represents an aryl radical or a substituted aryl radical; and $n$ represents an integer of from 1–2, which is obtained by reacting a polymer containing at least one active halogen atom with a salt of an $\alpha,\beta$-unsaturated carboxylic acid having the formula:

$$\mathrm{Ar{-}(YC{=}CX)_n{-}\underset{\underset{\displaystyle O}{\|}}{C}{-}OH}$$

wherein the definitions of X, Y, Ar and $n$ are respectively mentioned above; and a solvent for said photosensitive polymer.

BACKGROUND OF THE INVENTION

Field of invention

This invention relates to a photosensitive polymer and to a photosensitive composition containing said polymer. More particularly, this invention relates to a photosensitive polymer which may be used for preparing a photoresist or for photoengraving.

Description of prior art

Photosensitive polymer compositions are commonly used as photoresists or for photoengraving in a myriad number of applications. For many applications it is required that the photosensitive composition used have a high degree of sensitivity, good resolving power, good aging stability, good heat resistance, good adhesiveness and good etchant resistance. It should also be easily exposed and should not contain certain types of impurities, such as metals, which could adversely affect the properties of the resist or the properties of the object treated.

Polyvinylcinnamate containing photosensitive compositions are well known in the art, and widely used. This polymer is formed by reacting polyvinylalcohol with cinnamic acid. Its photosensitive composition is characterized, however, by low acid resistance and adhesiveness, and it cannot be applied to precious metals, certain glasses, silicone, germanium or ceramics. The range of application for this type of photosensitive composition is therefore limited.

Moreover, these compositions contain a significant amount of sodium, which can adversely affect electrical properties, which renders the use of this type of composition unacceptable for those applications involving the formation of electrical parts.

It has been considered to prepare a photosensitive polymer by polymerizing an alkylene oxide having a cinnamic acid radical. This polymerization reaction, however, is somewhat abnormal in characteristics so that the polymer is difficult to obtain.

SUMMARY OF THE INVENTION

Accordingly, it is one object of this invention to provide a photosensitive polymer and a photosensitive composition containing said polymer.

It is another object of this invention to provide a photosensitive polymer having an acceptable number of cinnamic acid radicals, which is useful for photoresist and photoengraving applications.

It is another object of this invention to provide a photosensitive polymer having a high sensitivity, good resolving power, good aging stability, good heat resistance, good adhesiveness and good etchant resistance.

These and other objects of this invention can be attained by providing a photosensitive composition containing a polymer having the radical as shown in the general formula:

$$\mathrm{Ar{-}(YC{=}CX)_n{-}\underset{\underset{\displaystyle O}{\|}}{C}{-}O{-}} \quad \text{(I)}$$

wherein X and Y represent, respectively, hydrogen or halogen atoms or cyano or nitro radicals; Ar represents an aryl radical or a substituted aryl radical; and $n$ represents an integer of from 1–2; which is obtained by reacting a corresponding polymer having an active halogen atom with a salt of an $\alpha,\beta$-unsaturated carboxylic acid having the general formula of:

$$\mathrm{Ar{-}(YC{=}CX)_n{-}\underset{\underset{\displaystyle O}{\|}}{C}{-}OH} \quad \text{(II)}$$

wherein the definitions of X, Y, Ar and $n$ are respectively mentioned above.

DETAILED DESCRIPTION OF PREFERRED EMBODIMENTS

The photosensitive polymer of this invention can be obtained by reacting a polymer containing an active halogen atom with a salt of an $\alpha,\beta$-unsaturated carboxylic acid, having the above formula (II).

Suitable polymers which contain an active halogen atom include preferably the halogen containing polyethers prepared by polymerizing a halocyclic ether, such as epichlorohydrin, epibromohydrin, 1,2-dichloro-3,4-epoxybutane, 1,1-dichloro - 1,3 - epoxypropane, 3,3-bis(chloromethyl) oxetane or 3,3-bis(bromomethyl)oxetane. These polymers are soft, oil resistant, ozone resistant, and have a high degree of adhesiveness.

These polymers may also be formed by copolymerizing and halocyclic ether with an alkyleneoxide, e.g., ethyleneoxide, propyleneoxide, or butyleneoxide; an epoxyether, e.g., methylglycidylether, or phenylglycidylether; an oxetane (trimethyleneoxide), e.g., oxetane, 3-methyloxetane, or 3,3-dimethyloxetane, or an epoxy compound, e.g., styreneoxide.

The polymer containing the active halogen atom, in addition to the above polyethers may also be such polymers as polyvinylchloride, copolymers of vinylchloride-vinylacetate: polymers of halogenoalkylvinylethers, e.g., $\beta$-chloroethyl-vinylether. The halogen content of the polymer is not particularly limited; however, it is preferably between 20–70 wt. percent.

Suitable $\alpha,\beta$-unsaturated carboxylic acids of the general formula (II) include, for example, cinnamic acid, 4-phenyl - 1,3-butadienecarboxylic acid, $\beta$-nitrophenylvinylcarboxylic acid, and $\beta$-phenyl $\alpha$-cyanovinylcarboxylic acid. These unsaturated carboxylic acids are reacted in the form of inorganic salts or organic amine salts. The desirable salts include the alkali metal salts, e.g., sodium, potassium, and lithium salts, and the quaternary ammonium salts, e.g., tetramethylammonium salt and trimethylbenzylammonium salt. Especially preferable is the use of the trimethylbenzylammonium salts and tetraethylammonium salts in order to provide a high reaction velocity.

It is possible to use the salts of the unsaturated carboxylic acid per se, or to use a combination of the unsaturated carboxylic acid together with a base for forming the salt, in the reaction system.

The reaction is usually conducted in a polar solvent in an atmosphere of an inert gas, such as nitrogen. Suitable solvents are preferably the dipole aprotic solvents, such as dimethylformamide, dimethylacetoamide, dimethylsulfoxide, triamide hexamethylphosphate, acetonitrile, and nitrobenzene. The temperature of the reaction is not limited, but it should preferably be higher than 60° C. to obtain a polymer having a high number of α,β-unsaturated carboxylic acid radicals. On the other hand, it is preferable that the reaction temperature be lower than 120° C. to prevent gel formation and undesirable coloring of the resulting polymer.

The reaction can be conducted without a catalyst; however, an organic base, such as an organic amine, e.g., pyridine; organic quaternary ammonium hydroxide, e.g., trimethylbenzylammonium hydroxide; organic quaternary ammonium salt, e.g., trimethylbenzylammonium chloride, can be used as the catalyst. The polymer can be recovered by precipitation in a non-solvent, such as methanol.

The resulting polymer has been found to contain the radicals shown in general formula (I) which partially or entirely replace the active halogen atoms in the starting polymer. Highest sensitivity and etchant resistance are obtained when 40–80% of halogen atoms in the starting polymer are replaced with the unsaturated carboxylic acid radicals.

The photosensitive composition of this invention can be prepared by dissolving the photosensitive polymer in a solvent. Suitable solvents for this purpose include any of the organic solvents known for dissolving this general type of polymer, including chlorobenzene, trichloroethylene, tetrahydrofuran, dioxane, methylcellosolve, methylcellosolve acetate, methylethyl ketone, methylisobutyl ketone, dimethylformamide, dimethylsulfoxide, and mixtures thereof. Especially preferable is chlorobenzene. The solvent may be used in a sufficient amount to dissolve said polymer.

Any of a variety of conventional sensitizers can be used in the photosensitive compositions of this invention. Suitable sensitizers include, for example, the aromatic nitro compounds, e.g., trinitroaniline, nitronaphthalene, 5-nitroacenaphthene, 2-nitrofluorene, picramide; the ketones, e.g., benzophenone, Michler's ketone; the quinones, e.g., naphthoquinone, anthraquinone, 2,3-diphenylanthraquinone; the anthrones, e.g., benzathrone and pyrylium salts. When the photosensitive composition is used as a photoresist, it is preferable to use 5-nitroacenaphthene, picramide, or benzanthrone as the photosensitizer. The quantity of sensitizer to use is usually 0.1–10% by weight based on the weight of the photosensitive polymer.

Conventional stabilizers, e.g., hydroquinone, t-butylcatechol; plasticizers, e.g., triazene, triethyleneglycol dipropionate and various dyes or pigments, may be added to the photosensitive composition depending upon the particular application.

The photosensitive compositions of this invention can be used in the form of films or can be used by coating onto a support, which can be metal, plastic, glass or paper, etc. The photosensitive compositions of this invention have the excellent properties of high sensitivity, good resolving power, good acid resistance, and good heat stability, as shown in the following examples. Accordingly, these materials can be widely used as photosensitive materials in a variety of applications. For example, they may be used as photoresists for preparation of printed circuits, for preparation of IC, for chemical milling, for printing plates for relief printing and intaglio processes and for photoprinting plates. They are especially effective for use in the preparation of IC by projection exposure methods, since the composition has high sensitivity and is less effected by air than conventional compositions. The photosensitive composition can be also used for the preparation of printing plates by photo-engraving, used in lithograph or screen printing, or for the preparation of relief images. Moreover, they may be used for the preparation of copy and microfilm.

Having generally described the invention, a further understanding can be obtained by reference to certain specific examples which are provided herein for purposes of illustration only and are not intended to be limiting unless otherwise specified.

EXAMPLE 1

Preparation of the polymer 2.8 g. of polyepichlorohydrin, having a reduced viscosity η sp./c.=2.03 (0.1 g./dl. benzene sol. 30° C.) (manufactured by Nippon Zeon Co., Ltd.) was mixed with 70 ml. of dimethylformamide (hereinafter referred to as DMF), and was dissolved by heating in an atmosphere of nitrogen gas.

7.7 g. of sodium cinnamate, suspended in 50 ml. of DMF, was added to said solution. 1.1 g. of benzyltrimethyl ammonium chloride was further added to said mixture as a catalyst and the mixture was reacted at 110° C. for 4 hours in a dark room. (All of the reactions hereinafter stated were conducted in an atmosphere of nitrogen gas in a dark room.) The resulting solution was washed several times with methanol and then with water, and the product was dissolved in THF, and was purified by reprecipitation with methanol. 4.03 g. of white polymer was obtained by drying under reduced pressure.

The infrared spectrum and elementary analysis of the resulting polymer showed that 56% of the chlorine atoms of the polyepichlorohydrin was replaced with cinnamic acid radicals. (Hereinafter, the rate of replacement of cinnamic acid radical is referred to as cinnamic acid conversion.)

This reaction and purification were repeated, without the use of benzyltrimethyl ammonium chloride as a catalyst. A white rubberlike polymer, having 19% of cinnamic acid conversion, was obtained.

EXAMPLE 2

Preparation of polymer 4.0 g. of polyepichlorohydrin, obtained by fractional precipitation, having a reduced viscosity of η sp./c.=2.03 (0.1 g./dl. benzene sol. 30° C.) (manufactured by Nippon Zeon Co., Ltd.), was mixed with 140 ml. of DMF, and was dissolved by heating in an atmosphere of nitrogen gas.

8.35 g. of cinnamic acid was dissolved in 110 ml. of benzene, and 23.5 g. of a 40% methanol solution of trimethylbenzyl ammonium hydroxide was added thereto and heated. The water resulting from the neutralization reaction, benzene and methanol, were distilled to obtain trimethylbenzyl ammonium cinnamate. The trimethylbenzyl ammonium cinnamate was mixed with the DMF solution of polyepichlorohydrin and reacted at 80° C. for 2.5 hours in an atmosphere of nitrogen gas. The resulting product was purified similarly as described in Example 1, to yield 4.7 g. of a polymer having a 44% cinnamic acid conversion.

EXAMPLE 3

Preparation of polymer

The process of Example 2 was repeated, using the same conditions except that the reaction time was 5.5 hours. A white polymer, having 63% cinnamic acid conversion, was obtained.

EXAMPLES 4–8

Preparation of polymer

The process of Example 2 was repeated using the same conditions, except polyepichlorohydrin having a reduced viscosity $\eta$ sp./c.=3.3 (0.1 g./dl. benzene sol. 30° C.) was used and the reaction times were respectively changed as stated in the following table:

| | Reaction time (hour) | Cinnamic acid conversion (percent) |
|---|---|---|
| Example: | | |
| 4 | 0.5 | 9 |
| 5 | 1.0 | 15 |
| 6 | 2.0 | 24 |
| 7 | 3.0 | 33 |
| 8 | 5.0 | 46 |

EXAMPLE 9

Preparation of polymer 0.92 g. of polyepichlorohydrin, having a reduced viscosity $\eta$ sp./c.=2.7 (0.1 g./dl. benzene sol. 30° C.) was completely dissolved in 33 ml. of DMF. 1.93 g. of cinnamic acid and 19.3 g. of a 10% aqueous solution of tetraethylammonium hydroxide, were dissolved in 50 ml. of methanol, and methanol and water were completely removed by distillation. The DMF solution of polyepichlorohydrin was added to the resulting product, and was reacted at 110° C. for 5 hours in an atmosphere of nitrogen gas, in the absence of light. 1.8 g. of white polymer, having a 98% cinnamic acid conversion, was obtained.

EXAMPLE 10

Preparation of polymer 2.8 g. of copolymer of propyleneoxide and epichlorohydrin, 7.3 g. of potassium cinnamate and 2.5 g. of 40% methanol solution of trimethylbenzyl ammonium hydroxide were added to 100 ml. of DMF and were reacted at 110° C. for 5 hours. The polymer having a 75% cinnamic acid conversion was obtained.

EXAMPLE 11

Preparation of polymer 2.8 g. of polyepichlorohydrin, as used in Example 1, 5.6 g. of sodium cinnamate, and 1.0 g. pyridine, as a catalyst, were mixed, and were added to 80 ml. of DMF, and were reacted at 110° C. for 4 hours. The polymer having a 50% cinnamic acid conversion was obtained.

EXAMPLE 12

Preparation of polymer 2.8 g. of polyepichlorohydrin, as used in Example 1, 6.4 g. of ammonium cinnamate, 2.5 g. of methanol solution of trimethylbenzyl ammonium hydroxide, as a catalyst, and 100 ml. of DMF, were mixed and were reacted at 110° C. for 5 hours. 2.95 g. of a white rubberlike polymer, having a 15% cinnamic acid conversion, was obtained.

EXAMPLE 13

Preparation of polymer 4.1 g. of polyepibromohydrin, 8.4 g. of potassium cinnamate, 1.0 g. of trimethylbenzyl ammonium bromide, as a catalyst, and 100 ml. of DMF, were mixed, and were reacted at 110° C. for 5 hours.

A white rubber-like polymer, having a 60% cinnamic acid conversion, was obtained.

EXAMPLES 14–16

Preparation of polymer 12.8 g. of polyepichlorohydrin, as used in Example 1, was dissolved in 50 ml. of DMF. Suspension solutions of the following salts in 50 ml. of DMF were respectively added to the polyepichlorohydrin solution, and reacted at 110° C. for 5 hours.

Polymers having the following cinnamic acid conversions were obtained:

| Example | Salt of acid | Amount of salt (g.) | Cinnamic acid conversion (percent) |
|---|---|---|---|
| 14 | [1] 14 | 13.4 | 50 |
| 15 | [2] 15 | 12.6 | 21 |
| 16 | [3] 16 | 12.6 | 60 |

[1] 14—trimethylbenzyl ammonium salt of $\beta$-nitrophenylvinyl carboxylic acid.
[2] 15—trimethylbenzyl ammonium salt of $\beta$-phenyl-$\alpha$-cyanovinyl carboxylic acid.
[3] 16—trimethylbenzyl ammonium salt of 4-phenyl-butadiene carboxylic acid.

EXAMPLES 17–19

Preparation of polymer

Each of the following halogen containing polymers was dissolved in 50 ml. of DMF. A suspension solution of 11.6 g. of trimethylbenzyl ammonium cinnamate in 50 ml. of DMF, was added to said polymer solution, and reacted according to the conditions stated in the table. A polymer having the following cinnamic acid conversion was obtained:

| | Polymer | | Reaction conditions | | |
|---|---|---|---|---|---|
| Example | Type | Amount (g.) | Temp. (° C.) | Time (hr.) | Cinnamic acid conversion (percent) |
| 17 | Polyvinylchloride | 1.9 | 60 | 5 | 30 |
| 18 | Copolymer of vinylchloride and vinylacetate. | 2.2 | 60 | 5 | 20 |
| 19 | Poly($\beta$-chloroethyl vinylether) | 3.2 | 110 | 5 | 65 |

EXAMPLE 20

The polymer of Example 1 was dissolved in DMF and was coated onto a sheet of glass and was dried. The coated sheet of glass was exposed for 5 seconds by using a mercury lamp (manufactured by Ushio Denki K.K. under trade name of Unipalse UM–301) from a distance of 40 cm. to obtain a solvent insoluble-acid resistant film.

EXAMPLE 21

A photosensitive composition was prepared by dissolving 1 g. of the polymer of Example 3 in a solvent mixture of 10 ml. of tetrahydrofuran and 30 ml. of xylene. The mixture was coated onto a quartz plate (4.5 x 10 cm.) by a rotary coater to provide a thin film. The solvent was removed by vacuum drying at 70° C. for 10 minutes, and a negative film for a photosensitive plate, was placed on the plate, and was exposed for 10 minutes by a mercury lamp from a distance of 60 cm. After exposure, the unexposed parts were dissolved with trichloroethylene to obtain a clear image.

EXAMPLE 22

0.5%, based on the weight of polymer of a sensitizer, 5-nitroacenaphthene, was added to the photosensitive composition prepared in Example 22. The composition was coated on a sheet of glass and was exposed for 3 seconds at a distance of 125 cm., in accordance with the process of Example 20. The sensitivity was measured by use of Step tablet No. 2, manufactured by Eastman Kodak Co., Ltd.

It was found that the film was cross-linked and insoluble to 8 steps. The results show that the film has 61 times the sensitivity of commercial KPR (polyvinylcinnamate manufactured by Eastman Kodak Co., Ltd.).

EXAMPLES 23–28

A photosensitive composition was prepared in accordance with the process of Example 21 by use of the following polymer, and the sensitivity was measured.

| Example | Polymer | Sensitizer | Conditions of exposure: Distance (cm.) | Conditions of exposure: Time (sec.) | Specific sensitivity |
|---|---|---|---|---|---|
| 23 | Example 2 | None | 60 | 5 | 40.5 |
| 24 | Example 5 | do | 60 | 90 | 3.0 |
| 25 | Example 6 | do | 60 | 60 | 9.0 |
| 26 | Example 7 | do | 60 | 60 | 13 |
| 27 | Example 8 | do | 60 | 60 | 25 |
| Ref | Polyvinylcinnamate | do | 64 | 60 | 1 |
| 28 | Example 8 | 5-nitroacenaphthene (10%). | 128 | 1.1 | 97,000 |
| Ref | KPR | Some sensitizer | 58 | 30 | 100 |

In Examples 24–27, the composition was coated onto a sheet of glass and was exposed from the rear. As shown in the above table, the photosensitive compositions of this invention have a high sensitivity, even though a sensitizer is not added. When a sensitizer is added, the sensitivity increases to several hundred times that of commercial products.

EXAMPLE 29

The photosensitive composition, prepared as in Example 22, was filtered and the filtrate was rotary-coated onto an aluminum metallized surface of a sheet of glass, and was dried at 70° C. for 10 minutes. A resolving power test chart was placed on the surface and was exposed for 3 seconds of a distance of 125 cm. by the mercury lamp. In accordance with the process of Example 21, the sheet was treated and the resolving power was measured by a microscope. A line having 2$\mu$ of width was completely and clearly reproduced.

EXAMPLE 30

The photosensitive composition prepared in accordance with Example 28 was coated onto a sheet of glass and was dried, and exposed for 1.1 seconds by the mercury lamp at a distance of 128 cm. The sheet was immersed in 46% hydrofluoric acid and the time required for strip-off was measured. As a reference, the same measurement was made for the commercial products of KPR, KMER and KTFP which are cyclic rubber containing azide compounds manufactured by Eastman Kodak Co., Ltd.

Time required for strip-off

Example 30 ............ No strip-off after 30 minutes.
Reference:
KPR ............ 2.2.
KMER ............ 26.
KTFR ............ 26.

EXAMPLE 31

A photosensitive composition was prepared in accordance with the process of Example 22 by using the polymer of Example 2. The composition was coated onto an aluminum metallized surface of a sheet of glass, and a negative film was placed on the sheet and was exposed and treated in accordance with the process of Example 22 to form an image.

The product was heated at 150° C. in vacuum for 20 minutes, and cooled, and was immersed in a corrosive solution mixture of 41% ammonium fluoride and 46% hydrofluoric acid at a volume ratio of 6:1. The time required for image deformation was measured.

Time for image deformation, min.

Example 31 ....... No deformation after 90 minutes.
Reference:
KPR ......... 19.
KTFR ....... 36.
KMER ....... 75.

As shown in Examples 30 and 31, the composition of this invention has a high degree of resistance, as a photoresist, against a corrosive solution, such as hydrofluoric acid.

EXAMPLE 32

A photosensitive composition was prepared in accordance with the process of Example 21 by using the polymer of Example 9. The composition was coated onto an aluminum foil which was sand-blasted and washed. The coated foil was dried, exposed and developed to obtain a clear image.

EXAMPLE 33

The photosensitive composition prepared in accordance with Example 22 was coated onto a silicon wafer covered with an oxidized film, and was made uniform by use of a spinner (4000 r.p.m./2 minutes). The product was pre-baked for 20 minutes in a drier, and was exposed for 3 minutes through a mask for IC by the mercury lamp, and was treated in accordance with the process of Example 21. The product was post-baked at 150° C. for 20 minutes and etched by the use of corrosive hydrofluoric acid by immersion. As a result, a satisfactory pattern of circuits was observed by a microscope.

EXAMPLE 34

The photosensitive composition prepared in accordance with Example 23 was coated onto a cleaned plate for printed circuitry. The coated plate was dried and exposed for 3 seconds under covering with an original negative film, and was developed and dried in accordance with the process of Example 21 to obtain a relief image on the printed circuit plate. A satisfactory printed circuit plate was obtained by etching with an aqueous solution of ferric chloride.

EXAMPLE 35

The photosensitive composition, prepared in accordance with Example 22, was coated on an aluminum plate, which was sand-blasted. The coated plate was dried and exposed through a negative film, and was developed in accordance with the process of Example 21, to prepare a lithographic printing plate. A clear printed matter was obtained in a conventional method with a lithographic printing machine by the use of the resulting printing plate.

EXAMPLE 36

The photosensitive composition was coated on a cleaned zinc plate and was dried, exposed, developed in accordance with the process of Example 35, and was heated at 150° C. for 3 minutes and was treated with a Dowetchant to obtain the printing plate for relief printing.

Having now fully described the invention, it will be apparent to one of ordinary skill in the art that many changes and modifications can be made thereto without departing from the spirit and scope of the invention as set forth in the appended Claims.

What is claimed as new and desired to be secured by Letters Patent of the United States is:

1. In a process for preparing a photosensitive polymer having at least one radical shown by the formula:

$$Ar—(YC=CX)_n—\overset{\overset{\displaystyle C}{\|}}{O}—O—$$

wherein X and Y, respectively, represent a hydrogen or halogen atom, or a cyano or nitro radical, Ar represents an aryl radical; and *n* represents an integer from 1–2; the improvement which comprises reacting a polymer containing at least one active halogen atom with a quaternary ammonium salt of an α,β-unsaturated carboxylic acid having the formula:

$$Ar—(YC=CX)_n—\underset{\underset{\displaystyle O}{\|}}{C}—O—$$

wherein the definition of X, Y, Ar and *n* are respectively indicated above.

2. The process of Claim 1, wherein 5–100% of the active halogen atoms in said polymer containing said active halogen atoms is reacted with the α,β-unsaturated carboxylic salt.

3. The process of Claim 1, wherein said polymer containing said active halogen atoms is selected from the group consisting of halogen containing polyethers, copolymers of halocyclic ethers, and a member selected from the group consisting of alkyleneoxides, epoxyethers, and oxetanes; polyvinylchloride, copolymer of vinylchloride-vinylacetate, and polymers of halogenoalkylvinylethers.

4. The process of Claim 1, wherein the quaternary ammonium salt is of a member selected from the group consisting of cinnamic acid, 4-phenyl-1,3-butadiene carboxylic acid, β-nitrophenylvinyl carboxylic acid, β-phenyl-α-cyanovinyl carboxylic acid.

5. The process of Claim 4, wherein the quaternary ammonium salt is tetramethyl ammonium salt, trimethylbenzylammonium salt or tetraethylammonium salt.

References Cited

UNITED STATES PATENTS

| | | | |
|---|---|---|---|
| 2,725,372 | 11/1955 | Minsk | 260—91.3 |
| 2,732,301 | 1/1956 | Robertson et al. | 95—7 |
| 3,409,593 | 11/1968 | Messwarb et al. | 260—47 |
| 3,694,383 | 9/1972 | Azami et al. | 260—2 X A |

OTHER REFERENCES

Chem. Abstracts *56,* 3650d (1962).
Chem. Abstracts *61,* 8435b (1964).

WILLIAM H. SHORT, Primary Examiner

E. A. NIELSEN, Assistant Examiner

U.S. Cl. X.R.

96—35.1, 115 R; 204—159.14; 260—30.8 DS, 30.4 EP, 31.4 EP, 32.6 R, 33.8 EP, 87.1, 92.8 A, 476 R